(12) United States Patent
Kobayashi

(10) Patent No.: US 6,873,058 B2
(45) Date of Patent: Mar. 29, 2005

(54) SEMICONDUCTOR DEVICE WITH CHIP-ON-FILM PACKAGE HAVING INSULATING FILM THAT RESISTS EDGE SHORTS

(75) Inventor: Kaname Kobayashi, Miyazaki (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 10/345,319

(22) Filed: Jan. 16, 2003

(65) Prior Publication Data

US 2003/0137034 A1 Jul. 24, 2003

(30) Foreign Application Priority Data

Jan. 18, 2002 (JP) ......................................... 2002-010255

(51) Int. Cl.[7] .............................................. H01L 23/48
(52) U.S. Cl. ...................................... 257/778; 257/787
(58) Field of Search ................................ 257/778, 787, 257/740, 772, 766, 779, 750, 751, 752, 782, 783

(56) References Cited

U.S. PATENT DOCUMENTS 5,767,571 A * 6/1998 Kimura et al. .............. 257/668
2003/0164551 A1 * 9/2003 Lee et al. .................... 257/778

* cited by examiner

Primary Examiner—Long Pham
Assistant Examiner—Dilinh Nguyen
(74) Attorney, Agent, or Firm—Rabin & Berdo, PC

(57) ABSTRACT

A semiconductor device includes a substrate having a first area on which a semiconductor element is mounted, a second area which surrounds the first area, and a third area located in a central portion of the first area; wirings extending from the second area to the third area and formed over the substrate; and an insulting film which is formed in the first and second areas so as to expose the third area and to cover portions of the substrate and the wirings. The semiconductor element which is electrically connected to the wirings within the third area. The semiconductor element has a size equal to the first area and is mounted on the first area so as to be spaced a predetermined interval from the insulating film.

13 Claims, 4 Drawing Sheets

SEMICONDUCTOR DEVICE WITH CHIP-ON-FILM PACKAGE HAVING INSULATING FILM THAT RESISTS EDGE SHORTS

CROSS REFERENCE TO RELATE APPLICATION

The present application claims priority under 35 U.S.C. §119 of Japanese Patent Application No. 2002-10255, filed Jan. 18, 2002, which is incorporated herein by reference in its entirety for all purposes.

BACKGROUND OF THE INVENTION

1. Field of the Invention

The present invention relates to a semiconductor device and a method of manufacturing the same, and particularly to a semiconductor package called a COF (Chip On Film) structure wherein a substrate and a semiconductor element are connected by a flip flop method.

2. Description of the Related Art

FIG. 6 is a bottom view of a semiconductor element or chip having a COF structure according to a conventional example, FIGS. 7(a) and 7(b) are respectively a top plan view of a substrate employed in the COF structure according to the conventional example and a cross-sectional view taken along line A–A' of FIG. 7(a), FIG. 8 is a cross-sectional view taken along line A–A' of FIG. 7(a), showing a state in which the substrate and the semiconductor element employed in the conventional example have been connected, and FIG. 9 is a cross-sectional view taken along line A–A' of FIG. 7(a), showing a state in which the COF structure according to the conventional example has been sealed, respectively. The conventional COF structure will be explained below.

As shown in FIG. 6, bump electrodes 2 are formed on an undersurface of a semiconductor element 1. The bump electrodes 2 are normally formed at a peripheral portion lying within the semiconductor element 1.

As shown in FIGS. 7(a) and 7(b), a plurality of wirings 4 are formed over a substrate 3, and the substrate 3 and the wirings 4 are covered with an insulating film 5. A polyimide film having flexibility, which has a thickness of 25 $\mu$m or 40 $\mu$m, is used for the substrate 3. However, the thickness of the substrate 3 described herein can be suitably set. A barrier metal 6 (nickel [Ni] and chromium [Cr] or nickel [Ni] and copper [Cu]) is sputtered on the surface of the substrate 3. Copper is then precipitated on the barrier metal 6 by a plating method to form a copper foil. The copper foil is subjected to photolitho and etching, whereby a plurality of the wirings 4 are formed. At least the wirings 4 at bump electrode connecting positions 7 are given tin plating. The wirings 4 extend from the periphery of the substrate 3 to a semiconductor element mounting area 8. The wirings 4 at the bump electrode connecting positions 7 are positioned so as to correspond to the bump electrodes 2 of the semiconductor element 1 within the semiconductor element mounting area 8. The insulating film 5 is formed so as to expose at least the semiconductor element mounting area 8. This is done to keep wide a space used as a hole for injection of an encapsulating material 9, which is defined between the substrate 3 and the end of the semiconductor element 1 upon sealing a space defined between the substrate 3 and the semiconductor element 1 by means of the encapsulating material 9 and facilitate the injection of the encapsulating material 9, as shown in FIG. 9.

As shown in FIG. 8, the wirings 4 at the bump electrode connecting positions 7 on the substrate 3, and the bump electrodes 2 formed on the semiconductor element 1 are respectively brought into alignment by a bonding device and electrically connected to one another. A thermocompression bonding method or the like is normally used as a method for connecting them. The thermocompression bonding method is a method of applying heat and pressure to the wirings 4 at the bump electrode connecting positions 7 and the bump electrodes 2 and melting tin plated onto the wirings 4 at the bump electrode connecting positions 7 to thereby connect the wirings 4 to the bump electrodes 2.

As shown in FIG. 9, the space defined between the substrate 3 and the semiconductor element 1 is sealed with the encapsulating material 9 injected through the space defined between the substrate 3 and the end of the semiconductor element 1. A resin is normally used as the encapsulating material 9.

FIG. 10 is a cross-sectional view taken along line A–A', showing a COF structure according to a conventional example where an edge short has occurred. In the COF structure according to the conventional example as shown in FIG. 10, there may be a case in which when wirings 4 and bump electrodes 2 are thermocompression-bonded, a substrate 3 is deformed due to heat and pressure as designated at numeral 10. In this case, there is a possibility that an edge-short problem will arise in that since the wirings 4 located on the downside of a semiconductor element 1 and its periphery are not covered with an insulating film 5, the wirings 4 are brought into contact with the semiconductor element 1 at a spot designated at numeral 10 so that the wirings 4 and the semiconductor element 1 are short-circuited.

SUMMARY OF THE INVENTION

According to the present invention, an insulating film, which covers wirings on a substrate, is caused to extend to a lower side of a semiconductor element. Thus, since the wirings are covered with the insulating film even when the substrate is deformed due to thermocompression bonding and the wirings contact portions other than the semiconductor element and bump electrodes, the possibility that an edge short will occur, is decreased.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Preferred embodiments of the present invention will hereinafter be described in detail with reference to the accompanying drawings.

A first embodiment showing a COF structure of the present invention will be explained below. The COF structure is called a structure wherein a semiconductor element is formed on a wiring board or substrate, the substrate and the semiconductor element are electrically connected to each other by a conductor, and a space defined between the substrate and the semiconductor element is encapsulated in resin for the purpose of protecting the conductor.

Figure 1:
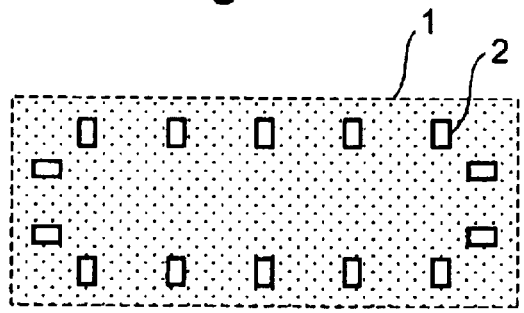
FIG. 1 is a bottom view of a semiconductor element according to a first embodiment of the present invention.
Figure 2A:
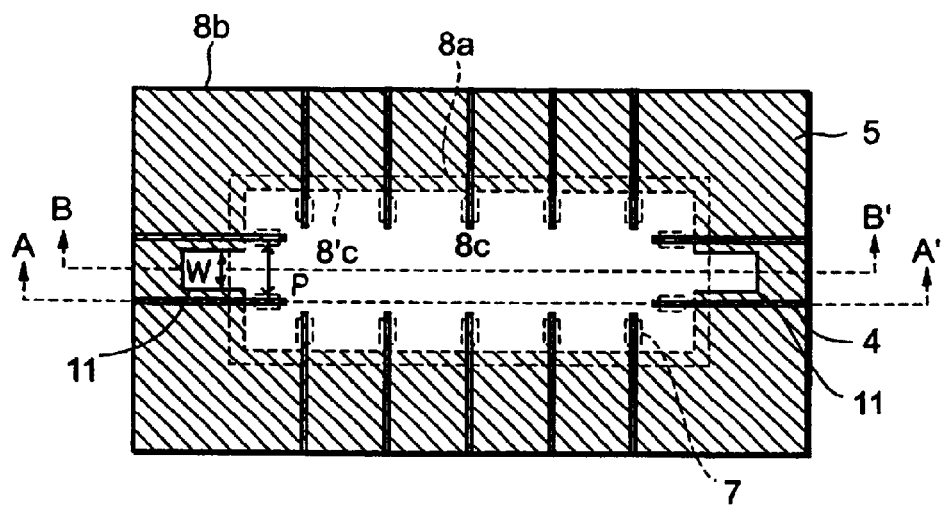
FIGS. 2(a) and 2(b) are respectively a top plan view of a substrate employed in the first embodiment of the present invention and a cross-sectional view taken along line A–A' of FIG. 2(a)
Figure 2B:
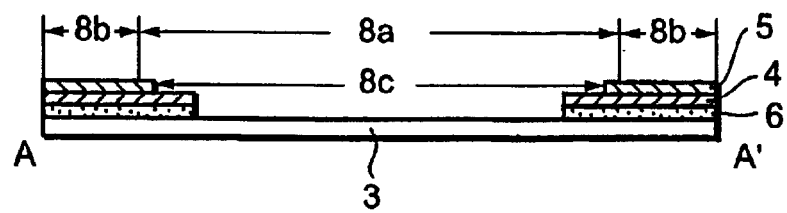
Figure 3A:
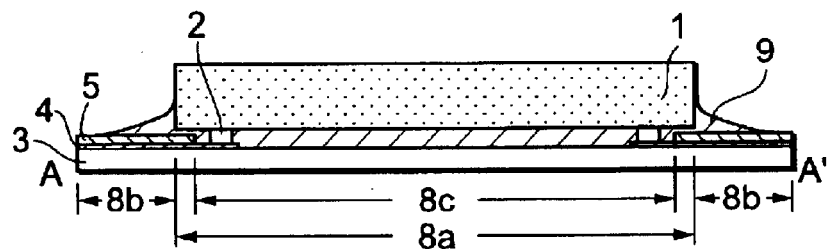
FIGS. 3(a) and 3(b) are respectively cross-sectional views taken along lines A–A' and B–B' in FIG. 2(a), showing a state in which the substrate and the semiconductor device according to the first embodiment of the present invention have been connected and encapsulated.
Figure 3B:
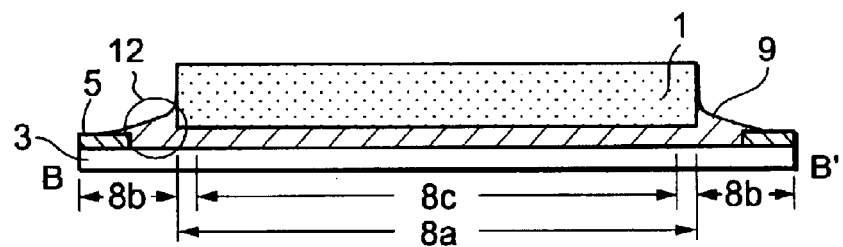
Figure 4:
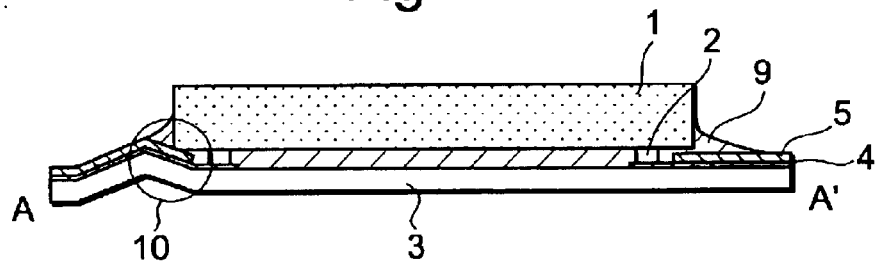
FIG. 4 is a cross-sectional view of a COF structure according to the first embodiment of the present invention, which is taken along line A–A' where the substrate has been bent.

FIG. 1 is a bottom view of a semiconductor element or chip having a COF structure according to the first embodiment of the present invention, FIGS. 2(a) and 2(b) are respectively a top plan view of a substrate employed in the COF structure according to the first embodiment of the present invention and a cross-sectional view taken along line A–A' of FIG. 2(a), FIGS. 3(a) and 3(b) are respectively cross-sectional views taken along lines A–A' and B–B' of FIG. 2(a), showing a state in which the substrate and the semiconductor element have been connected and encapsulated in the COF structure according to the first embodiment of the present invention, and FIG. 4 is a cross-sectional view of the COF structure, taken along line A–A' of FIG. 2 where the substrate has been bent in the COF structure according to the first embodiment of the present invention, respectively.

As shown in FIG. 1, bump electrodes 2 are formed on an undersurface of a semiconductor element 1.

Next, prior to the description of a substrate 3, the substrate 3 is divided into three areas as shown in FIGS. 2(a) and 2(b) for convenience of explanation. An area on which the semiconductor element 1 is mounted, is defined as a first area 8a, the periphery thereof is defined as a second area 8b, and a central portion of the first area 8a is defined as a third area 8c (the third area 8c might be called a "wiring exposed area" since it is of an area in which wirings are exposed as will be described subsequently), respectively.

As shown in FIGS. 2(a) and 2(b), a plurality of wirings 4 are formed over the substrate 3 so as to extend from the second area 8b to the third area 8c and so that the wirings 4 at bump electrode connecting positions 7 are placed in the third area 8c. While a plastic insulating film such as polyimide or polyester or the like having flexibility is used for the substrate 3, the thickness and quality of the substrate 3 can be suitably set. The wirings 4 are formed over the substrate 3 with a layer of a barrier metal 6 being interposed therebetween. The barrier metal 6 (nickel [Ni] and chromium [Cr] or nickel [Ni] and copper [Cu]) is sputtered on the surface of the substrate 3. Copper is then precipitated on the barrier metal 6 by a plating method to form a copper foil. The copper foil is subjected to photolitho and etching, so that a plurality of the wirings 4 are formed with predetermined pitches so as to approach each other. At least the wirings 4 at the bump electrode connecting positions 7 are given tin plating.

The substrate 3 and the wirings 4 are covered with an insulating film (e.g., a solder resist or an epoxy resin) 5. The insulating film 5 is provided to decrease the possibility that foreign matter will get into the wirings 4 from outside and the possibility that the wirings 4 will contact the semiconductor element 1 or the like at locations other than predetermined portions to thereby cause a short. Cut-away portions 11 for injecting an encapsulating material are provided at their corresponding predetermined portions of the insulating film 5 so as to facilitate the injection of the insulating material upon sealing a space defined between the substrate 3 and the semiconductor element 1.

The insulating film 5 is formed in the first area 8a and the second area 8b except for the third area 8c and the cut-away portions 11. While the insulating film 5 may cover at least the wirings 4 from the purpose thereof as described above, the insulating film 5 may preferably cover the whole upper area of the substrate 3, including the tops of the wirings 4 except for the third area 8c with a view toward increasing the strength of the substrate 3. Namely, the insulating film 5 covering the wirings 4 functions as a reinforcing plate for supporting the substrate 3 simultaneously with the function of insulating the wirings 4 from the periphery. Further, if the present insulating film 5 is formed of a solder resist employed even in the conventional process in this case, it can then be applied to the present embodiment by a mere change in size of an open area (area corresponding to the third area 8c) of a conventional solder resist. Accordingly, the present invention can be realized without substantially changing the conventional process, i.e., greatly increasing the cost.

The cut-away portions 11 are provided in areas other than the tops of the wirings 4 covered by the insulating film 5, so as to extend from a boundary line 8'c of the third area 8c to the second area 8b. The cut-away portions 11 function as injection holes for injecting the encapsulating material or exhaust holes for discharging air lying between the substrate 3 and the semiconductor element 1 in order to seal the space defined between the substrate 3 and the semiconductor element 1. Considering easiness of flow of the injected encapsulating material, such a structure that air lying in the space between the substrate 3 and the semiconductor element 1 is easy to be discharged when the encapsulating material is injected, is preferable. It is therefore desirable that the number of the cut-away portions 11 is at least two or more and the cut-away portions used as the injection and discharge holes are provided such that the cut-away portion used as the discharge hole is located in a position distant as far as possible from the cut-away portion used as the injection hole. For instance, cut-away portions 11 provided along the longitudinal direction of the substrate 3 so as to be symmetrical with respect to the central portion of the substrate 3, or cut-away portions 11 provided so as to be diagonal to the central portion of the substrate 3 are preferable. In order to make smooth the injection of the encapsulating material, the width W of each cut-away portion at the boundary line 8'c is preferably set as large as possible within the pitch P between the wirings 4. Namely, the size of the injection hole is set as wide as possible. The cut-away portions 11 shown in FIG. 2(*a*) are illustrated by way of example as cut-away portions 11 located in preferable positions and having preferable shapes or configurations.

As shown in FIGS. 3(*a*) and 3(*b*), the wirings 4 lying within the third area 8c above the substrate 3, and the bump electrodes 2 formed in the semiconductor element 1 are respectively brought into alignment by a bonding device and electrically connected by a thermocompression bonding method. The semiconductor element 1 is mounted in the first area 8a above the substrate 3. The space defined between the substrate 3 and the semiconductor element 1 is sealed with an encapsulating material (e.g., an epoxy resin, a silicon resin or the like) 9 injected through the cut-away portions 11.

In the first embodiment of the present invention as described above, the insulating film 5 extends to the lower side of the semiconductor element 1. Thus, since the wirings 4 are covered with the insulating film 5 even when the substrate 3 is deformed as designated at numeral 10 in FIG. 4 and thereby the wirings 4 contact the end of the semiconductor element 1 due to heat and pressure developed when the wirings 4 and the bump electrodes 2 are thermocompression-bonded, the occurrence of an edge short is reduced and the reliability of quality is enhanced. As a structure for preventing the occurrence of the edge short, may be considered one wherein the wirings 4 are insulated and coated one by one. Since, however, the solder resist is used for the insulating film 5 in the first embodiment as compared with the above, the strength of the substrate 3 is high and the substrate 3 is hard to bend. Since the insulating film 5 can be formed without a substantial change in the conventional process, the present invention can be realized with no substantial cost-up cost. Since the third area above the substrate 3 is surrounded by the insulating film 5, the encapsulating material 9 injected into the space defined between the substrate 3 and the semiconductor element 1 is dammed by the insulating film 5 about the third area. Thus, since the encapsulating material 9 is inhibited from flowing to the periphery of the substrate 3, predetermined spots can be sealed with a suitable amount of encapsulating material.

Further, a space defined between the substrate 3 and the end of the semiconductor element 1 is expanded by the thickness of the insulating film 5 as designated at numeral 12 in FIG. 3(*b*) due to the cut-away portion 11 and hence the injection of the encapsulating material 9 becomes easy. Thus, since even an encapsulating material low in flowability enables sealing, a selectable range of the encapsulating material 9 expands and the degree of freedom of design is enhanced. Since the expanded space can be sealed thick by the thickness of the insulating film 5 with the encapsulating material 9, and thereby the substrate 3 is hard to bend at that portion, an edge short can be prevented owing to the provision of the cutaway portion 11 at a portion that could cause the edge short.

Figure 5:
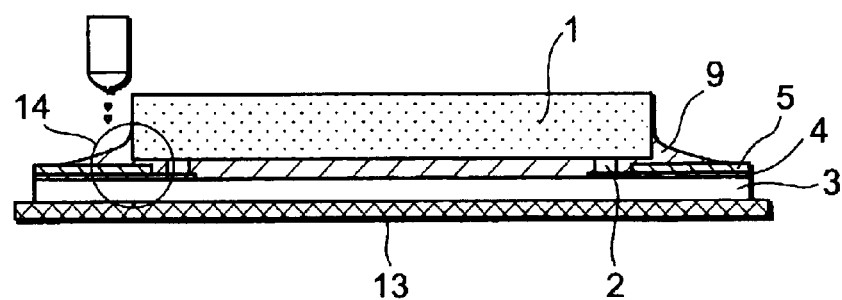
FIG. 5 is a cross-sectional view showing an encapsulating process of a method of manufacturing a semiconductor device according to a second embodiment of the present invention.
Figure 6:
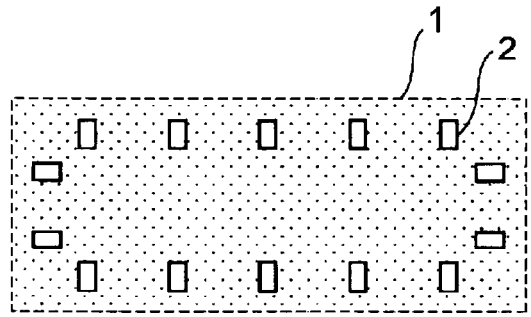
FIG. 6 is a bottom view of a semiconductor device according to a conventional example.
Figure 7A:
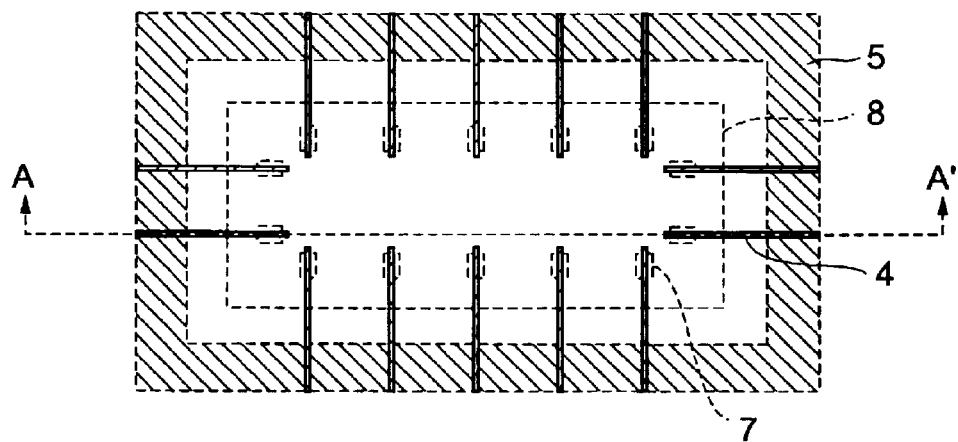
FIGS. 7(a) and 7(b) are respectively a top plan view of a substrate employed in the conventional example and a cross-sectional view taken along line A–A' of FIG. 7(a)
Figure 7B:
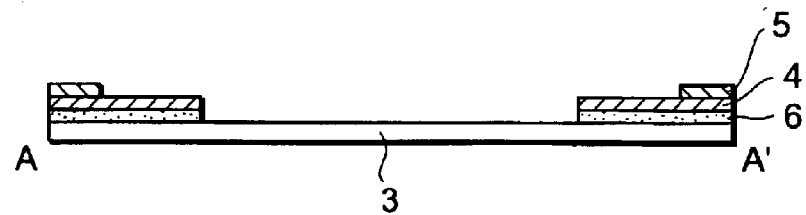
Figure 8:
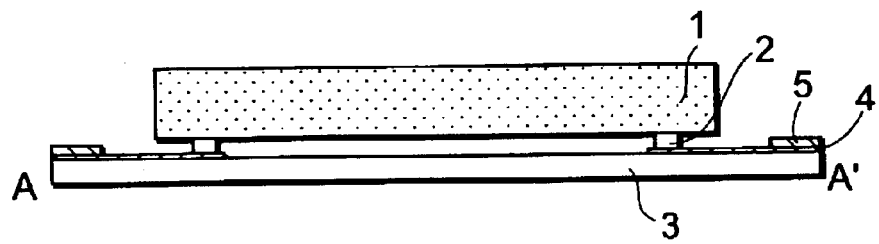
FIG. 8 is a cross-sectional view taken along line A–A' of FIG. 7(a), showing a state in which the substrate and the semiconductor device according to the conventional example have been connected.
Figure 9:
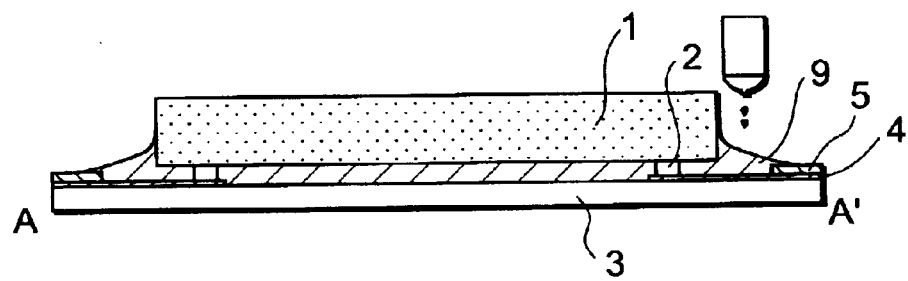
FIG. 9 is a cross-sectional view taken along line A–A' of FIG. 7(a), showing a state in which the semiconductor device according to the conventional example has been encapsulated.
Figure 10:
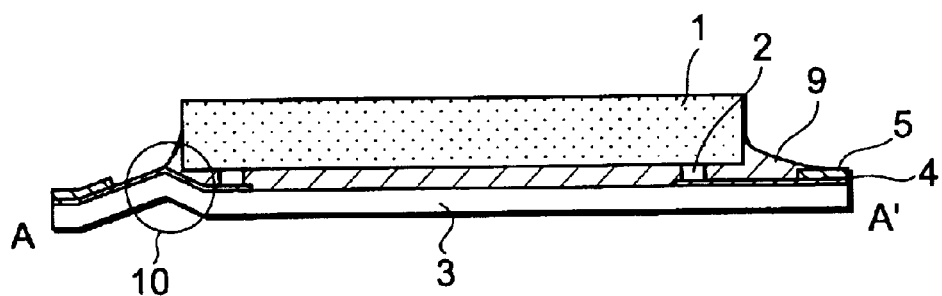
FIG. 10 is a cross-sectional view taken along line A–A' where an edge short has occurred in a semiconductor device according to a conventional example.

A second embodiment of the present invention relates to another method of manufacturing a semiconductor device having a COF structure. FIG. 5 is a cross-sectional view showing an embodiment of the method of manufacturing the semiconductor device, according to the second embodiment of the present invention.

In the second embodiment, stress is applied to the periphery of a substrate 3 to warp the periphery thereof to the downside upon sealing a space defined between the substrate 3 and a semiconductor element 1 with an encapsulating material 9, so that a space defined between the substrate 3 and the end of the semiconductor element 1 is expanded.

A first method of expanding the space between the substrate 3 and the end of the semiconductor element 1 is a method of placing a semiconductor device on a support table (e.g., a convex support table or the like) 13 whose central portion is higher than its periphery in height, in such a manner that a central portion of the substrate 3 on the lower side thereof is positioned to a central portion (or also called a top or convex portion) of the support table 13, pressing the periphery of the substrate 3 against the periphery of the support table 13 by means of a pressing jig (e.g., a pin or the like) to thereby fix the substrate 3 and the support table 13 and warp the substrate 3, thereby expanding a space defined between the substrate 3 and the end of the semiconductor element 1.

A second method is a method of placing a substrate 3 on a support table 13 having flexibility, and applying stress to the periphery of the substrate 3 to thereby flex the support table 13 and warp the periphery of the substrate 3 to the downside, thereby expanding a space defined between the substrate 3 and the end of the semiconductor element 1.

Next, an encapsulating material 9 is injected through the expanded space (spot designated at numeral 14 in FIG. 5) to seal the space between the substrate 3 and the semiconductor element 1. While the central portion of the substrate 3 is lifted depending on the shape of the support table 13 so that the space defined between the substrate 3 and the semiconductor element 1 is slightly narrowed, the encapsulating material 9 injected through the space defined between the substrate 3 and the end of the semiconductor element 1 is easily expanded between the substrate 3 and the semiconductor element 1 by means of a capillary phenomenon and is thereby capable of sealing a predetermined area, thus no leading to interference with sealing.

In the second embodiment of the present invention as described above, the injection of the encapsulating material 9 becomes easy upon sealing owing to the expansion of the space between the substrate 3 and the end of the semiconductor element 1. Since the encapsulating material 9 low in flowability also enables sealing, an encapsulating material selectable range becomes wide and hence the degree of freedom of design is enhanced.

The sealing method described herein can be used even in the semiconductor device having the COF structure according to the first embodiment of the present invention.

Since wirings are covered with an insulating film even when a substrate is bent due to heat and pressure developed upon thermocompression bonding and thereby the wirings contact the end of a semiconductor element, the occurrence of an edge short is reduced owing to the extension of the insulating film to the downside of the semiconductor element, and the reliability of quality is hence enhanced. Further, cut-away portions for injecting an encapsulating material are defined in the insulating film, and a substrate is warped to thereby expand between the substrate and the end of the semiconductor element upon sealing between the substrate and the semiconductor element, whereby the injection of the encapsulating material becomes easy. Since an encapsulating material low in flowability also enables sealing, a selectable range of the encapsulating material becomes wide and hence the degree of freedom of design is enhanced.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A semiconductor device, comprising:
   a substrate over which a semiconductor element is mounted, the substrate having a first area, a second area which surrounds the first area, and a third area located in a central portion of the first area, the semiconductor element having a peripheral portion that overlies the first area of the substrate but not the second area of the substrate;
   wirings extending from the second area to the third area and formed over the substrate; and
   an insulting film which is disposed over the first and second areas so as to expose the third area, the insulating film covering portions of the substrate and the wirings,
   wherein the semiconductor element is electrically connected to the wirings within the third area,
   wherein the semiconductor element has a size substantially equal to the first area and is mounted over the first and third areas so as to be spaced apart from the substrate by a predetermined interval, and
   wherein the insulating film has cut-away portions provided so as to extend from the outer periphery of the third area to the second area.

2. The semiconductor device according to claim 1, wherein the substrate is flexible.

3. The semiconductor device according to claim 1, wherein the insulating film is a solder resist.

4. The semiconductor device according to claim 1, wherein the wirings are provided in plural form and the plurality of wirings are placed at predetermined pitches, and the widths of the cut-away portions are respectively narrower than the predetermined pitches.

5. The semiconductor device according to claim 1, wherein the insulating film is disposed over substantially all of the first and second areas except for the third area and the cut-away portions.

6. The semiconductor device according to claim 1, wherein the substrate and is spaced apart from the semiconductor element by a predetermined interval, which is sealed with an encapsulating material.

7. The semiconductor device according to claim 1, wherein the peripheral portion of the semiconductor element overlaps part of the insulating film.

8. A semiconductor device, comprising:
   a substrate;
   a plurality of wirings on the substrate and extending from a periphery thereof to a central portion thereof;
   an insulating film which covers portions of the substrate and the wirings; and
   a semiconductor element disposed above the central portion of the substrate,
   wherein the wirings have inner ends that are located in a wiring exposed area lying over the central portion of the substrate, the insulating film extends from the periphery of the substrate to an area beneath a lower side of the semiconductor element so as to space the substrate a predetermined interval from the semiconductor element, the insulating film has cut-away portions which extend from the wiring exposed area to locations outside the central portion, and the wirings and the semiconductor element lying within the wiring exposed area are electrically connected to each other.

9. The semiconductor device according to claim 8, wherein the substrate is flexible.

10. The semiconductor device according to claim 8, wherein the insulating film is a solder resist.

11. The semiconductor device according to claim 8, wherein the wirings are disposed at predetermined pitches, and the widths of the cut-away portions are respectively narrower than the predetermined pitches.

12. The semiconductor device according to claim 8, wherein the insulating film is disposed over substantially all of the substrate except for the wiring exposed area and the cut-away portions.

13. The semiconductor device according to claim 8, wherein the space between the substrate and the semiconductor element is sealed with an encapsulating material.

* * * * *